United States Patent [19]

Anderson et al.

[11] Patent Number: 5,014,181
[45] Date of Patent: May 7, 1991

[54] MAGNETIC AMPLIFIER PACKAGE AND METHOD OF COOLING THE SAME

[75] Inventor: W. Kyle Anderson, Rockford; Merle L. Bennett, Cherry Valley, both of Ill.

[73] Assignee: Sundstrand Corporation, Rockford, Ill.

[21] Appl. No.: 431,827

[22] Filed: Nov. 6, 1989

[51] Int. Cl.⁵ .............................................. H02M 7/06
[52] U.S. Cl. ..................................... 363/126; 330/8; 361/385; 363/141
[58] Field of Search ........................... 363/82, 91–93, 363/125, 126, 141; 323/329, 338; 336/58, 94; 330/8; 361/385

[56] References Cited

U.S. PATENT DOCUMENTS

| 3,085,188 | 4/1963 | Drabeck et al. | 363/141 |
| 3,718,850 | 2/1973 | Juri et al. | 336/105 |
| 3,906,336 | 9/1975 | DePuy | 363/141 |
| 4,178,630 | 12/1979 | Olsson | 363/141 |

FOREIGN PATENT DOCUMENTS

| 1215563 | 4/1960 | France |  |
| 269312 | 4/1970 | U.S.S.R. |  |
| 936291 | 6/1982 | U.S.S.R. |  |
| 1074380 | 10/1985 | U.S.S.R. | 363/126 |

Primary Examiner—William H. Beha, Jr.
Attorney, Agent, or Firm—Antonelli, Terry, Stout & Kraus

[57] ABSTRACT

A magnetic amplifier package (1) comprises a diode rectifier (6) and a plurality of saturable reactors in the form of toroids (2) having cores (3), gate windings (4) and control windings (5). The diode rectifier and the saturable reactors are located within a housing (7) of the package. The housing has an inlet (18) and outlet (19) for cooling fluid and a passage (20) within the housing for circulating coolant between the inlet and the outlet for cooling both the diode rectifier and the saturable reactors. The magnetic amplifier package is compact, lightweight and efficiently cooled to facilitate its use in aircraft.

14 Claims, 4 Drawing Sheets

MAGNETIC AMPLIFIER PACKAGE AND METHOD OF COOLING THE SAME

TECHNICAL FIELD

The present invention relates to an improved magnetic amplifier package and to a method of making and a method of cooling the same. The magnetic amplifier package is one which comprises a diode rectifier and at least one saturable reactor electrically connected to an output of the rectifier.

BACKGROUND ART

A magnetic amplifier is a device which utilizes saturable core reactors, either alone or in combination with other circuit elements to obtain amplification or control. The magnetic amplifier is one of the earliest known types of electrical amplifying devices. It is sometimes referred to as a transductor, direct-current transformer, or saturable reactor. The development in the late 1940's and early 1950's of square-loop core material and improved rectifiers provided the basis for widespread application of both high-gain and large-power-handling capability magnetic amplifiers. A self-saturating magnetic amplifier is formed by connecting half-wave rectifying elements such as diodes in series with each winding of a saturable reactor. Full-wave and polyphase magnetic-amplifier circuits can be built up by connecting a reactor in each rectifier anode circuit.

Thus, while magnetic amplifiers, per se, are known, in the special environment of high performance aircraft, for example, if a magnetic amplifier is to be used it must occupy a minimum of space and be lightweight. It is also highly desirable that a magnetic amplifier in an aircraft be efficiently cooled in order to minimize the possibility of thermal damage to the components thereof and also to provide a greater capacity over correspondingly sized uncooled magnetic amplifiers. There is also a need for easy removal of the components of a magnetic amplifier in the event of component failure. The cost and labor assembly time for making the magnetic amplifier are also preferably kept to a minimum. The present invention addresses these problems and needs and provides a solution thereto.

DISCLOSURE OF INVENTION

An object of the present invention is to provide an improved magnetic amplifier package which is compact, lightweight and efficiently cooled so that it may be advantageously be employed in high performance aircraft. A further object of the invention is to provide a method of cooling a magnetic amplifier package which minimizes the possibility of thermal damage to the components and which results in a magnetic amplifier having a greater capacity as compared with a correspondingly sized uncooled magnetic amplifier. An additional object of the invention is to provide an improved method of assembling a magnetic amplifier package which enables the components of the magnetic amplifier package to be manufactured at relatively low cost and to be assembled with relatively low labor assembly time in a manner which permits the components to be easily removed from the magnetic amplifier package for servicing in the event of component failure.

These and other objects of the invention are attained by the improved magnetic amplifier package of the invention which comprises a diode rectifier, at least one saturable reactor, means for housing the diode rectifier and the at least one saturable reactor, the means for housing including an inlet for cooling fluid and an outlet for cooling fluid nd wherein passage means are provided means are provided for circulating coolant between the inlet and the outlet for cooling both the diode rectifier and the at least one saturable reactor. In the disclosed form of the invention a plurality of saturable reactors are arranged along a longitudinal axis of the package. The saturable reactors are in the form of toroids which are arranged in stacked relation along the longitudinal axis of the package.

The passage means for circulating coolant comprises a plurality of flow deflector plates which are respectively sandwiched between adjacent ones of the stacked toroids for directing cooling fluid back and forth in a direction transverse to a stacking direction of the toroids and in contact with the toroids for cooling the toroids. The deflector plates include support portions on which the toroids are supported and passage is intermediate the support portions to permit cooling fluid to flow between the deflector plates and the toroids transverse to the stacking direction of the toroids. The deflector plates are configured such that they alternately block axial coolant flow along the stacking direction radially inwardly of the toroids while permitting such coolant flow radially outwardly of the toroids, and block coolant flow along the stacking direction radially outwardly of the toroids while permitting such coolant flow radially inwardly of the toroids whereby the coolant is required to flow back and forth in a direction transverse to the stacking direction and in contact with the toroids for cooling the toroids.

The diode rectifier of the magnetic amplifier package comprises a plurality of diode wafers. The saturable reactors of the package are electrically connected to the electrical outputs of the diode wafers. Particularly, the diode rectifier is a three-phase bridge rectifier wherein the diode wafers are arranged sandwiched between respective conductor plate members in stacked relation along a longitudinal axis of the package.

The means for housing of the magnetic amplifier package in the disclosed embodiment includes an elongated, cylindrical body which is open at its opposite ends. Covers are removably secured to close the open ends of the cylindrical body. One of the covers is formed with an inlet for circulating cooling fluid and the other with an outlet for the cooling fluid. The diode rectifier of the magnetic amplifier package is located adjacent the inlet in the disclosed form in the invention but could be positioned elsewhere within the package. In the disclosed form of the invention the at least one saturable reactor is positioned between the diode rectifier and the outlet. The passage means for circulating coolant between the inlet and the outlet conveys coolant through the diode rectifier and thereafter cools the at least one saturable reactor before exiting from the outlet of the package.

A further feature of the invention is the provision of the plurality of electrical conductors connected to the diode rectifier and the at least one saturable reactor of the magnetic amplifier package. These electrical conductors extend through openings in the means for housing for making electrical connections with the diode rectifier and the at least one saturable reactor. Seal means are provided for sealing the openings of the means for housing about the electrical conductors extending therethrough to prevent leakage of coolant from the package through the openings.

The cylindrical body of the housing in the disclosed form of the invention includes a partition within the cylindrical body which subdivides the interior of the housing. The diode rectifier is located within the cylindrical body on one side of the partition and the at least one saturable reactor is located within the cylindrical body on the other side of the partition. A passage extends through the partition for circulating coolant.

The method of making a magnetic amplifier of the invention comprises providing a diode rectifier subassembly and a subassembly of a plurality of saturable reactors. The diode rectifier subassembly includes a plurality of conductor plate members and diode wafers sandwiched between adjacent conductor plate members and the subassembly of a plurality of saturable reactors includes a plurality of saturable reactors in the form of toroids which are arranged in a stack. The subassemblies are inserted in a housing through which a cooling fluid can be circulated. Flow deflector members are provided between adjacent ones of the plurality of saturable reactors in the subassembly of the saturable reactors which is inserted in the housing. According to the disclosed embodiment of the method, the subassemblies are inserted in opposite ends of the housing and positioned on respective sides of a partition which subdivides the interior of the housing. However, it is also envisioned that the two subassemblies could be assembled adjacent one another before being placed within the housing, with or without the use of a partition although with a partition it would be necessary that the partition be movably and preferably removably positioned with respect to the remainder of the housing.

The method of cooling a magnetic amplifier of the invention comprises providing a magnetic amplifier package including a diode rectifier and a plurality of saturable reactors arranged in a housing and circulating a cooling fluid through the housing from a cooling fluid inlet of the housing to a cooling fluid outlet of the housing such that the cooling fluid circulates in contact with both the diode rectifier and the plurality of saturable reactors. In particular, according to the preferred embodiment of the method, the fluid is circulated laterally within the spaces between the conductor plate members in the diode rectifiers and between the torroids in the plurality of saturable reactors in contact with the diode wafers and toroids, respectively, for cooling the diode rectifier and the plurality of saturable reactors.

These and other objects, features and advantages of the present invention will become more apparent from the following description when taken in connection with the accompanying drawings, which show, for purposes of illustration only, one preferred embodiment in accordance with the present invention.

BEST MODE FOR CARRYING OUT THE INVENTION

Figure 5:
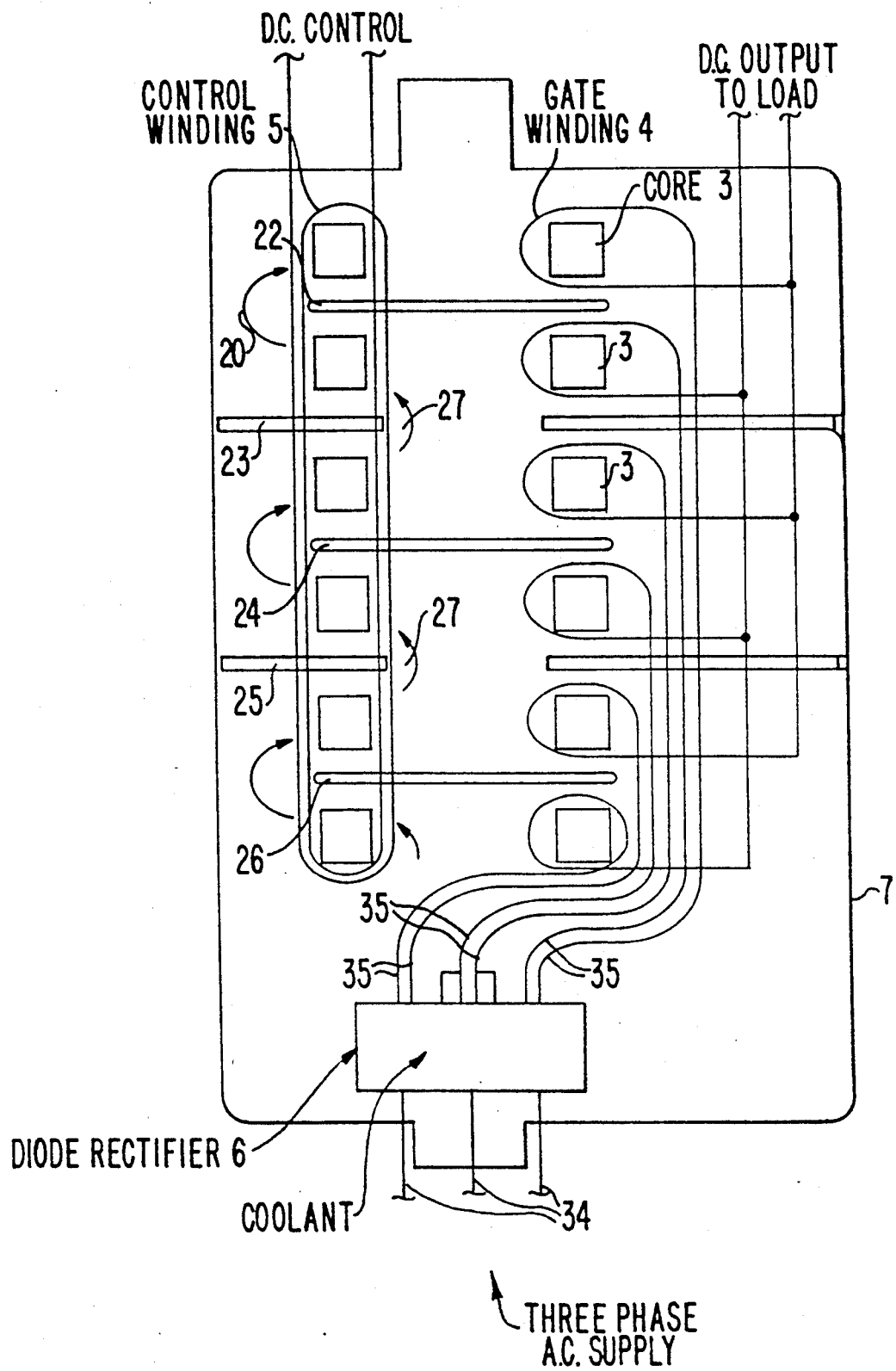
FIG. 5 is a schematic drawing of the magnetic amplifier package of FIG. 1 illustrating the arrangement of the electrical components and also the flow path of the cooling fluid through the package.
Figure 6:
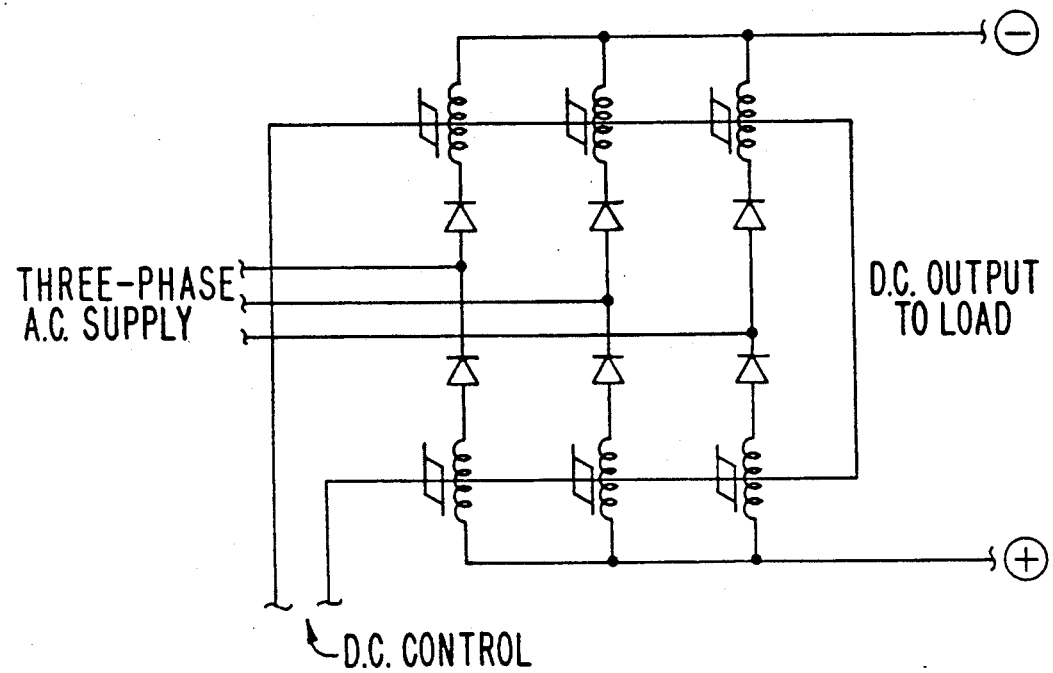
FIG. 6 is an electrical diagram of the magnetic amplifier package of FIG. 1.

Referring now to the drawings, a magnetic amplifier package 1 comprises six saturable reactors 2 each having a core 3 in the form of toroids of ferrite or other conventional material with gate windings 4 and control windings 5 extending about the toroids in the manner schematically illustrated in FIG. 5. The saturable reactors 2 are centered about and stacked along the longitudinal axis of a housing 7 of the package as discussed in more detail below. The magnetic amplifier package further comprises a three-phase bridge rectifier 6 located in the housing 7 beneath the six saturable reactors 2. The rectifier 6 comprises a plurality of diode wafers 8 the outputs of which are electrically connected to respective ones of the saturable reactors in the manner schematically illustrated in the circuit diagram of FIG. 6. Three-phase alternating current is supplied to the three-phase bridge rectifier. The direct current output of the rectifier is controlled by means of a direct current control signal applied to the control windings 5 about the cores 3 for controlling the direct current output of the magnetic amplifier.

Figure 9:
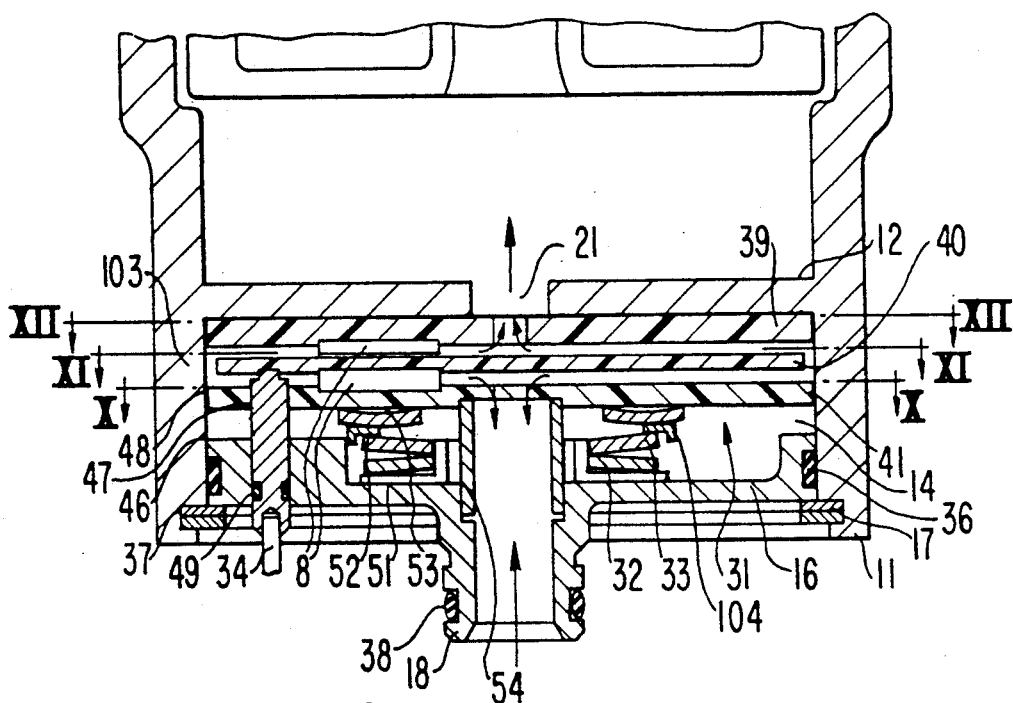
FIG. 9 is an enlarged cross-sectional view of the lower end of the magnetic amplifier package of FIG. 1 taken along the line IX—IX in FIG. 4.
Figure 10:
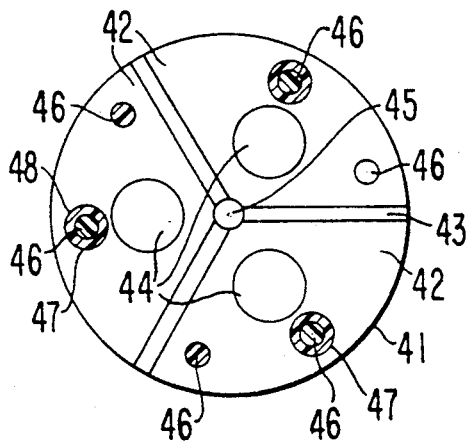
FIG. 10 is a top view of the lower plate member in the diode rectifier of FIG. 9 as seen in a cross-section thereof taken along the line X—X.
Figure 11:
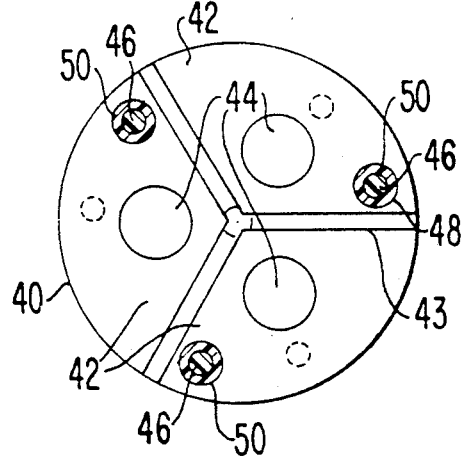
FIG. 11 is a top view of the middle plate member of the diode rectifier of FIG. 9 as seen from the section line XI—XI immediately above the plate member.
Figure 12:
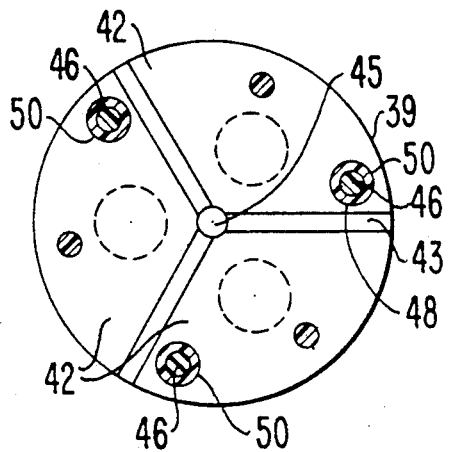
FIG. 12 is a top view of the upper plate member of the diode rectifier of FIG. 9 as seen from a section along the line XII—XII.

The housing 7 is formed with an upper cylindrical body portion 9 and a coaxial lower cylindrical body portion 103 which are open at their respective ends 10 and 11. The body 9 has an integral partition 12 which subdivides the interior of the housing into upper and lower compartments 13 and 14 for respectively receiving the subassembly of the saturable reactors 2 with gate windings 4 and control windings 5, and the subassembly of components of the diode rectifier 6 through the respective ends 10 and 11 of the body 9. Covers 15 and 16 are provided to close the ends 10 and 11 of the housing. The covers are retained thereon through the use of retaining rings 17 and 100 illustrated in FIGS. 1 and 9. The several components of the housing 7 are made of non-conductive material such as plastic. Illustratively, a nylon plastic, i.e. Torlon, could be employed.

The lower cover 16 of the magnetic amplifier package 1 is formed with an inlet fitting 18 and the upper cover 15 is constructed with an outlet fitting 19. A coolant passage 20 generally indicated by the arrows in FIG. 5 is provided within the package 1 between the inlet fitting 18 and outlet fitting 19 for circulating coolant between the inlet and outlet fittings for cooling both the diode rectifier 6 and the saturable reactors 2 within the housing 7 of the package 1. The interior partition 12 is formed with a central aperture 21 which defines a portion of the coolant passage 21 between the diode rectifier and the saturable reactors 2.

The subassembly of the six saturable reactors 2 formed of the cores 3, gate windings 4 and control windings 5 includes five flow deflector plates 22-26 which are respectively sandwiched between adjacent ones of the saturable reactors 2 for directing cooling fluid back and forth in a direction transverse to the stacking direction of the saturable reactors 2 along axis A—A. More specifically, absent the flow deflector plates 22-26, coolant from the aperture 21 and partition 12 would be free to flow unobstructed along the longitudinal axis A—A of the package 1 to the outlet fitting 19 at the opposite, upper end of the package. However, alternate ones of the flow deflectors plates, 22, 24 and 26, obstruct this flow of coolant through the central open area of the toroid-shaped cores 3 and direct the coolant flow radially outward with respect to the cores 3 so that it passes around the deflector plates between the radially outer edge of the deflector plates and the inner surface of the housing.

During this flow the coolant directly contacts the windings 4 and 5 and the cores 3 of the saturable reactors 2. As seen from FIGS. 1 and 5, the diameter of the deflector plates 22, 24 and 26 which obstruct central flow through the saturable reactors stops well short of the interior wall of the cylindrical body 9 thereby allowing flow of coolant around the peripheral edges of the deflector plates as indicated by the arrows in FIG. 5. The deflector plates 23 and 25 intermediate deflector plates 22, 24 and 26 are each formed with a central aperture 27 for permitting flow of the fluid coolant, typically oil, along the axis A—A through the center of the toroids. The outer circumference of the flow deflector plates 23 and 25 is greater than that of deflector plates 22, 24 and 26 such that the deflector plates 23 and 25 extend within 0.010-0.020 inch from the inner circumference of the cylindrical body 9 of the housing 7. This is restrictive to significant coolant flow therethrough whereby the deflector plates 23 and 25 serve to deflect the flow against the outer portions thereof radially inwardly to a central aperture 27 for cooling the saturable reactors and for continued flow through a central aperture 27 in the plates toward the outlet fitting 19.

Figure 1:
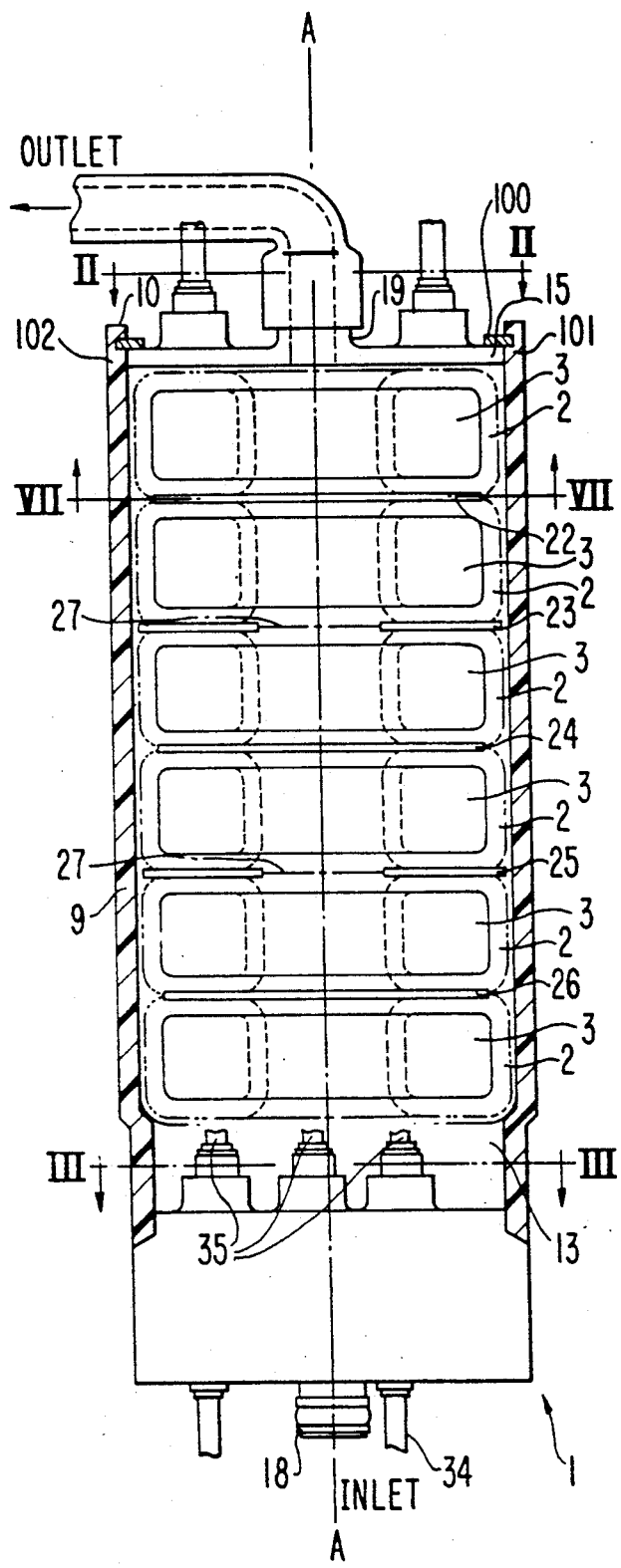
FIG. 1 is a side view partially in cross-section, of a magnetic amplifier package according to the invention.
Figure 2:
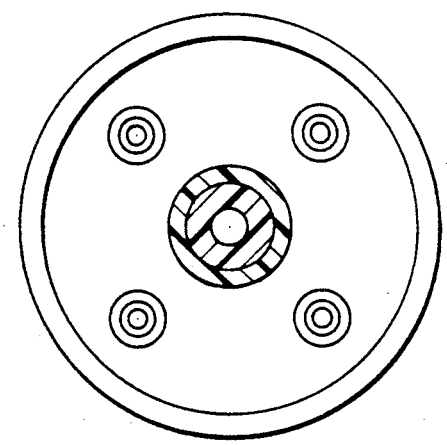
FIG. 2 is a top end view of the magnetic amplifier package of FIG. 1 as seen from the section line II in FIG. 1.
Figure 3:
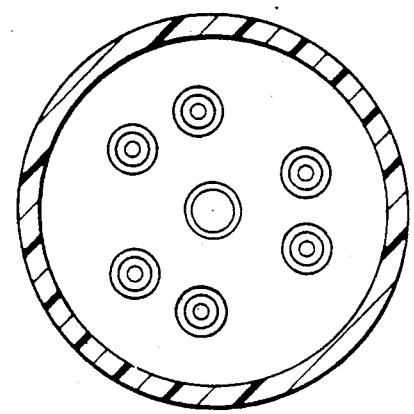
FIG. 3 is a cross-sectional view of the diode rectifier package of FIG. 1 taken along the line III—III.
Figure 4:
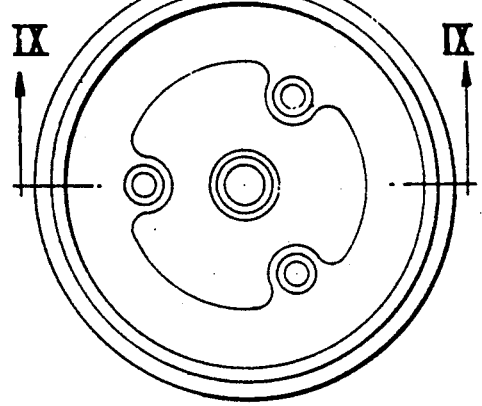
FIG. 4 is a bottom end view of the magnetic amplifier package of FIG. 1.
Figure 7:
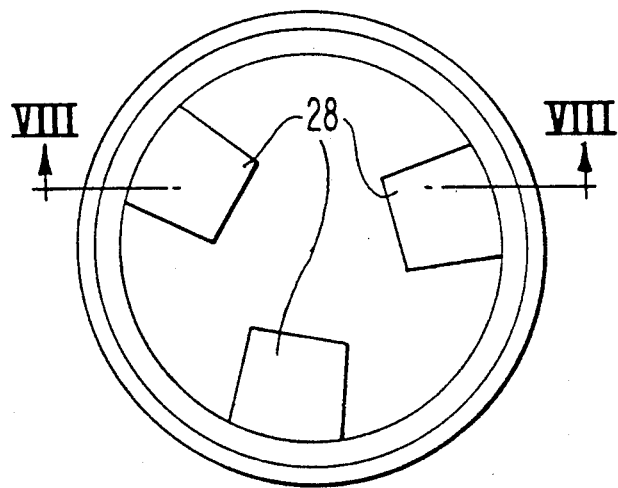
FIG. 7 is a cross-sectional view of the magnetic amplifier package of FIG. 1 taken along the line VII—VII just below a coolant deflector plate.
Figure 8:
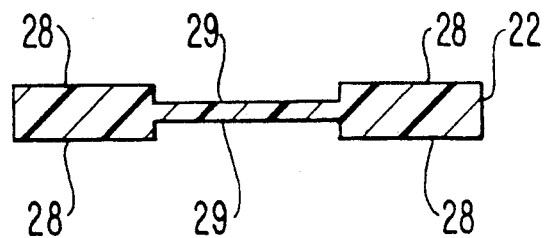
FIG. 8 is a cross-sectional view of the coolant deflector plate of FIG. 7 taken along the line VIII—VIII.

The flow deflector plates 22-26 and also the inner surface of upper cover 15 may be formed with support portions 28 on which the toroids are supported. Passages 29 are defined intermediate the support portions 28 to enhance cooling fluid flow between the deflector plates and toroids transverse to the stacking direction of the toroids, see particularly FIGS. 7 and 8. The stack of toroids rests on a shoulder in the housing inside diameter in its assembled position within the package 1 as shown in FIG. 1. As a result of the support portions 28 on the flow deflector plates 22-26 and also on the lower surface of cover 15, and the action of the deflector plates in alternatively prohibiting and permitting flow through the respective toroids, the passage 20 through the subassembly of the toroids circulates coolant fluid laterally within spaces between the stacked saturable reactors and in contact with the saturable reactors for efficiently cooling the reactors.

The rectifier 6 comprises a diode stack assembly 31 which is axially compressed within the lower compartment 14 of the housing 7 along the central axis A—A of the rectifier and the housing by means of a pair of Bellville springs 32 and 33. The rectifier 6 comprises six diode wafers 8 arranged in three stacks, each containing two diode wafers, with the diode wafers 8 being sandwiched between respective conductive members 42 of the rectifier as discussed in more detail below. The axial compressive force from the springs 32 and 33 is used to make conductive contact between the diode wafers 8 and the conductive members 42.

As noted above, the rectifier 6 is a three-phase bridge rectifier for rectifying a three-phase alternating current input by respective phase conductors 34. Six conductors 35 transport the rectified current from respective ones of the diode wafers to the gate windings 4 of respective ones of the toroids 2 in the manner shown in the circuit diagram of FIG. 6 and also the schematic drawing of FIG. 5.

O-ring seals 36 and 102 between the covers 15 and 16 and the cylindrical body 9 and cylindrical body 103 of the housing 7 prevent leakage of coolant between the outer edge of the covers and the cylindrical body 9. Retaining ring 17 is received in slot 37 and retaining ring 100 in slot 101 for securing the covers on the cylindrical body. In the rectifier 6, the cover 16 resists the outwardly directed axial force from the Bellville springs 32 and 33 which compress the diode stack assembly 31. The inlet fitting 18 on the cover 16 has an o-ring seal 38 about the fitting for sealing engagement with an adaptive device used for delivering the cooling fluid. The upper cover 15 has a structure similar to lower cover 16 so it is not shown in detail.

The conductive members 42 of the diode stack assembly 31 are assembled in the form of plate members 39, 40 and 41. More particularly, each of the plate members comprises three conductor members 42 in the form of plates of solid copper or other conductive material. Alternatively, the conductive members 42 could be conductive coatings formed on an insulating material. Where the three conductive members 42 are solid conductive material, each plate member is insulated from the others by an insulator 43 which keeps the members from touching one another. Preferably, the three conductive members 42 and insulator 43 are integrated to form a single structure as by bonding. The insulator 43 is formed of an insulating material such as plastic or ceramic.

The conductor plates 42 on their opposed surfaces are each formed with a socket 44 for receiving the ends of respective diode wafers 8. The three sockets on each of the opposing faces of the plate members 39, 40 and 41 are spaced equiangularly about the center of the plate members and the axis A—A of the package 1. An aperture 45 is formed in the center of each of the plate members 39 and 41 for conveying fluid coolant through the plate members along the axis A—A. The diameter of the plate members 39 and 41 is such that they have a normal clearance between their outer diameter and the inner diameter of the cylindrical body 9 of, for example, 0.010-0.020 inch, which is restrictive to significant coolant flow therethrough. The plate member 40 has no central aperture for coolant flow therethrough and has a diameter such that the clearance between the outer diameter of the plate member and the inner diameter of the cylindrical body 103 of the housing 7 is at least ten times that between the plate members 39 and 40 and the cylindrical body so that liquid coolant can freely flow about the outer periphery of the plate member 40. This arrangement of the plate members 39, 40 and 41 causes the liquid coolant to flow back and forth between the spaces between the plate members as it moves along the axis A—A from the inlet fitting 18 to the outlet fitting 19 and in direct contact with the diode wafers 8 for cooling the diode wafers. The efficient cooling which this arrangement enables the diode wafers to operate efficiently under high current loads whereby the weight and size of the rectifier can be kept to a minimum.

Phase conductors 34 are connected to respective conductor plates 42 of the intermediate plate member 40 by way of respective conductor bars 46 which extend from outside the cover 16 through apertures in the cover 16 and also in the conductor plates 42 of the lower plate member 41 to the conductor plates 42 of plate member 40. The upper ends of these conductor bars 46 are connected to the respective conductor plates 42 of plate member 40 by brazing or cooperating screw threads. Insulation 48 is provided around conductor bars 46 where they pass through the conductor plates 42 of the lower plate member 41 for electrically insulating the conductor bars and conductor plates. insulating the conductor bars and conductor plates. One of the conductor bars 46 is shown in cross-section in FIG. 9. Similarly, conductor bars extend upwardly from the conductor plates 42 of the lower plate member 41 and also from the conductor plates of the upper plate member 39 through openings in the partition 12 for outputting the rectified current from the respective diode wafers 8 to the saturable reactors Appropriate leads within the housing 7 connect the output conductor bars to the gate windings of the respective toroids 2 as shown schematically in FIG. 5. Four conductor bars also extend through the upper cover 15 for inputting the direct current control to the control windings 5 and for outputting direct current from the gate windings 4. O-ring seals between the respective covers and conductor bars seal the openings in the covers against leakage of coolant. The conductor bars extending from the conductor plates 42 of the lower plate member 41 extend through apertures 50 in the conductor plates 42 of the upper plate member 39 and intermediate plate member 40 with appropriate insulation 48 being provided about the conductor bars. Instead of apertures for passage of the conductor bars, the conductor plates 42 could be notched in their corners to allow passage of the conductor bars.

The upper ends of the conductor bars extending through the partition 12 and the lower ends of the conductor bars extending through the upper cover 15 can be connected to the respective gate windings and control windings by flexible leads. The leads for connection to the upper ends of the conductor bars extending through the partition 12 preferably have a made before insertion of the saturable reactors with respective cores 3, gate windings 4 and control windings 5 into the upper compartment 13 of the housing 7. However, other arrangements for the electrical connections could be employed as would be readily apparent to the skilled artisan.

The diode wafers 8 sandwiched between the respective conductor plates of the plate members 39, 40 and 41 are axially loaded by the pair of Bellville springs 32 and 33. The springs are located between an annular support member 51 on the cover 16 and an annular load distribution ring 104 on an annular load distribution plate 52 for equalizing the spring load applied to the three diode stacks. The lower surface of the load distribution plate 52 is formed as a spherical seat having a radius matching that of the adjacent load distribution ring 104. The compressive load from the spring is applied to each diode stack by way of the plate 52 through a second level load distribution swivel seat 53. An insulating coolant guide 54 extends between the inlet fitting 18 and the central aperture in the lower plate member 41 for introducing coolant to the space between the plate member 41 and the plate member 40.

From the foregoing, it is seen that the method of making a magnetic amplifier package according to the invention comprises the steps of providing a diode rectifier subassembly and a subassembly of a plurality of saturable reactors. The diode rectifier subassembly includes a plurality of conductor plates and a plurality of diode wafers sandwiched between adjacent conductor plates. The subassembly of a plurality of conductor plates. The subassembly of a plurality of saturable reactors includes a plurality of toroids which are arranged in a stack. The subassemblies are inserted in a housing through which a cooling fluid can be circulated. Flow deflector members are provided between adjacent ones of the plurality of saturable reactors before the subassembly of the plurality of saturable reactors is inserted in the housing. In the disclosed form of the invention the subassemblies are inserted in opposite ends of the housing 7 and positioned on respective sides of the partition 12 which subdivides the interior of the housing. However, it is possible that the partition 12 could be formed separately from the cylindrical body of the housing or not employed so that both subassemblies could be assembled together outside the housing and then inserted together into the housing.

The magnetic amplifier package 1 of the invention is especially advantageous for use in aircraft because of the minimal space occupied by the package and also its lightweight. The efficient cooling of the diode rectifier and saturable reactors of the magnetic amplifier provided by the package minimizes the possibility of thermal damage to the components and also provides a greater capacity over correspondingly sized uncooled magnetic amplifiers. The magnetic amplifier package and method of making the same also require relatively low labor assembly time thereby minimizing manufacturing costs. Moreover, with the magnetic amplifier package of the invention, the components can be easily removed for servicing in the event of component failure.

While we have shown and described one embodiment in accordance with the present invention, it is understood that the same is not limited thereto, but is susceptible to numerous changes and modifications as known to those skilled in the art. For example, the diode rectifier need not be placed at an end of the housing of the package but could be located in the middle of the package in the stack of saturable reactors with, for example three toroids on each end of the package. Therefore, we do not wish to be limited to the details shown and described herein, but intend to cover all such changes and modifications as are encompassed by the scope of the appended claims.

We claim:

1. A magnetic amplifier package comprising a diode rectifier, a plurality of saturable reactors arranged along a longitudinal axis of the package, means for housing the diode rectifier and the saturable reactors, said means for housing including an inlet for cooling fluid and an outlet for cooling fluid, wherein passage means are provided for circulating coolant between said inlet and said outlet for cooling both said diode rectifier and said saturable reactors and wherein said saturable reactors are in the form of toroids which are arranged in stacked relation along the longitudinal axis of the package.

2. A magnetic amplifier package according to claim 1, wherein said diode rectifier comprises a plurality of diode wafers arranged in stacked relation along a longitudinal axis of the package.

3. A magnetic amplifier package according to claim 1, wherein said diode rectifier is arranged along the longitudinal axis of the package.

4. A magnetic amplifier package according to claim 1, wherein said means for housing includes an elongated housing have said inlet at one end and said outlet at the opposite end, and wherein said diode rectifier is adjacent said inlet and said at least one saturable reactor is between said diode rectifier and the outlet.

5. A magnetic amplifier package according to claim 1, wherein said passage means comprises a plurality of flow deflector plates which are respectively sandwiched between adjacent one of the stacked toroids for directing cooling fluid back and forth in a direction transverse to a stacking direction of the toroids and in contact with the toroids for cooling said toroids.

6. A magnetic amplifier package according to claim 5, wherein said deflector plates includes support portions on which said toroids are supported and passages intermediate the support portions to permit cooling fluid to flow between said deflector plates and said toroids transverse to the stacking direction of the toroids.

7. A magnetic amplifier package according to claim 6, wherein said deflector plates are configured such that the alteratively block axial coolant flow along the stacking direction radially inwardly of the toroids while permitting such coolant flow radially outwardly of the toroids, and block coolant flow along the stacking direction radially outwardly of the toroids while permitting such coolant flow radially inwardly of the toroids whereby the coolant is required to flow back and forth in a direction transverse to the stacking direction and in contact with the toroids for cooling said toroids.

8. A magnetic amplifier package comprising a diode rectifier, at least one saturable reactor, means for housing the diode rectifier and the at least one saturable reactor, said means for housing including an inlet for cooling fluid and an outlet for cooling fluid, wherein passage means are provided for circulating coolant between said inlet and said outlet for cooling both said diode rectifier and said at least one saturable reactor, wherein said diode rectifier comprises a plurality of diode wafers and wherein a saturable reactor is electrically connected to an electrical output of each diode wafer.

9. A magnetic amplifier package comprising a diode rectifier, at least one saturable reactor, means for housing the diode rectifier and the at least one saturable reactor, said means for housing including an inlet for cooling fluid and an outlet for cooling fluid, wherein passage means are provided for circulating coolant between said inlet and said outlet for cooling both said diode rectifier and said at least one saturable reactor, and wherein said diode rectifier is a three-phase bridge rectifier.

10. A magnetic amplifier, package comprising a diode rectifier, at least one saturable reactor, means for housing the diode rectifier and the at least one saturable reactor, said means for housing including an inlet for cooling fluid and an outlet for cooling fluid, wherein passage means are provided for circulating coolant between said inlet and said outlet for cooling both said diode rectifier and said at least one saturable reactor, and further comprising a plurality of electrical conductors connected to said diode rectifier and said at least one saturable reactor and extending through openings in said means for housing for making electrical connections with said diode rectifier and said at least one saturable reactor, and wherein seal means are provided for sealing the openings of the means for housing about the electrical conductors extending therethrough to prevent leakage of coolant through said openings.

11. A magnetic amplifier package comprising a diode rectifier, at least one saturable reactor, means for housing the diode rectifier and the at least one saturable reactor, said means for housing including an inlet for cooling fluid and an outlet for cooling fluid, wherein passage means are provided for circulating coolant between said inlet and said outlet for cooling both said diode rectifier and said at least one saturable reactor, and wherein said means for housing comprises a cylindrical body which is open at each end, and covers for closing the respective ends of the cylindrical body.

12. A magnetic amplifier package according to claim 11, wherein said housing includes a partition within the cylindrical body, the diode rectifier being located within the cylindrical body on one side of the partition and the at least one saturable reactor being located within the cylindrical body on the other side of the partition, said passage means extending through said partition for circulating said coolant.

13. A magnetic amplifier package comprising a diode rectifier, a plurality of saturable reactors in the form of toroids having gate windings and control windings, said toroids being arranged in a stack, a housing containing said diode rectifier and said plurality of saturable reactors, and passage means for circulating coolant in said housing in contact with said diode rectifiers and said saturable reactors for cooling said diode rectifier and saturable reactors, wherein said saturable reactors are stacked in spaced relation along a longitudinal direction of the housing to allow circulation of coolant therebetween, and wherein said passage means circulate coolant laterally within spaces between the stacked saturable reactors and in contact with the saturable reactors for cooling the saturable reactors.

14. A method of cooling a magnetic amplifier package including a diode rectifier and a plurality of saturable reactors within a housing, said saturable reactors being in the form of torroids which are stacked in spaced relation, said method comprising introducing a cooling fluid into said housing through a cooling fluid inlet, circulating the cooling fluid within said housing in contact with both the diode rectifier and the plurality of saturable reactors enroute from the inlet to a cooling fluid outlet in the housing such that the cooling fluid is deflected back and fourth within the housing between the reactors in a direction transverse to a stacking direction of the saturable reactors, and removing the cooling fluid which has circulated within the housing from the housing through said cooling fluid outlet.

* * * * *